United States Patent
Li et al.

(10) Patent No.: US 12,061,237 B2
(45) Date of Patent: Aug. 13, 2024

(54) DETECTING WHETHER A BATTERY MANAGEMENT SYSTEM IS ABNORMAL

(71) Applicant: O2Micro Inc., Santa Clara, CA (US)

(72) Inventors: Guoxing Li, Sunnyvale, CA (US);
Xiaojun Zeng, Shanghai (CN);
Yingguo Zhang, Wuhan (CN)

(73) Assignee: O2Micro Inc., Santa Clara, CA (US)

( * ) Notice: Subject to any disclaimer, the term of this patent is extended or adjusted under 35 U.S.C. 154(b) by 719 days.

(21) Appl. No.: 17/204,759

(22) Filed: Mar. 17, 2021

(65) Prior Publication Data

US 2021/0199722 A1   Jul. 1, 2021

Related U.S. Application Data

(63) Continuation-in-part of application No. 15/959,064, filed on Apr. 20, 2018, now Pat. No. 11,038,356.

(30) Foreign Application Priority Data

Feb. 9, 2021   (CN) ......................... 202110175863.2

(51) Int. Cl.
*G01R 1/36*   (2006.01)
*G01R 31/36*   (2020.01)
*G01R 31/385*   (2019.01)
*H01M 10/42*   (2006.01)
*H02J 7/00*   (2006.01)

(52) U.S. Cl.
CPC ....... *G01R 31/3648* (2013.01); *G01R 31/385* (2019.01); *H02J 7/0014* (2013.01); *H02J 7/0029* (2013.01); *H02J 7/0047* (2013.01); *H01M 2010/4271* (2013.01)

(58) Field of Classification Search
None
See application file for complete search history.

(56) References Cited

U.S. PATENT DOCUMENTS 10,449,862 B2 * 10/2019 Kanai ............... G01R 35/00
11,038,356 B2 * 6/2021 Zhang ............... H01M 10/425
2018/0043781 A1 2/2018 Kanai et al.
2018/0316197 A1 11/2018 Zhang et al.

FOREIGN PATENT DOCUMENTS

JP   2015175676 A   10/2015

* cited by examiner

*Primary Examiner* — Leigh M Garbowski

(57) ABSTRACT

A method for detecting whether a battery management system is abnormal includes: calculating a value of a theoretical time constant corresponding to a first cell; determining a preset range of the theoretical time constant; controlling a first switch to turn off for a first time period, turn on for a second time period, turn off for a third time period; measuring a voltage on a first capacitor at end of first time period, to produce a measured voltage of first cell; measuring voltages on first capacitor at least at one time point in third time period, to produce measured capacitance voltages; determining a value of a measured time constant according to at least one of measured capacitance voltages and the measured voltage of first cell; and determining the battery management system is abnormal, if the value of the measured time constant exceeds the preset range of the theoretical time constant.

20 Claims, 12 Drawing Sheets

DETECTING WHETHER A BATTERY MANAGEMENT SYSTEM IS ABNORMAL

RELATED APPLICATION

This application is a continuation-in-part application of the U.S. application Ser. No. 15/959,064, titled "Open Cell Detection Method and Open Cell Recovery Detection Method in A Battery Management System," filed on Apr. 20, 2018, now U.S. Pat. No. 11,038,356, which is hereby incorporated by reference in its entirety. This application also claims priority to Chinese Patent Application No. 202110175863.2, titled "Detecting Whether a Battery Management System is Abnormal," filed on Feb. 9, 2021, with the National Intellectual Property Administration of the People's Republic of China (CNIPA).

BACKGROUND

Usually, a nickel tape or a wire is used as a connecting wire to connect a battery management system with each cell, to enable the battery management system to measure the voltage of each cell and to perform a corresponding protection operation if needed. If the connecting wire and/or related components in the battery management system are abnormal, the measured voltage of each cell will not be accurate, in which case the battery management system may perform the wrong protection operation.

In a conventional method, the voltage value on a capacitor in the battery management system is compared with the cell tap open threshold $V_{CTO}$, to determine whether the measured voltage of each cell is accurate. However, the conventional method only can determine the inaccuracy of the measured voltage of each cell caused by an abnormal connection. Thus, the conventional method results in an incorrect diagnosis, which will cause the battery management system to perform the incorrect protection operation.

SUMMARY

Embodiments in accordance with the present invention provide methods for detecting whether a battery management system is abnormal that addresses the problem with the conventional method discussed above.

In embodiments, a method for detecting whether a battery management system is abnormal, wherein the battery management system comprises a measure unit, a control unit, a first monitoring resistor, a second monitoring resistor, a first capacitor, a first switch and a first balance resistor, where a first cell in a battery pack is coupled to the first monitoring resistor, the second monitoring resistor, the first capacitor, the first switch and the first balance resistor, the method comprising: calculating, using the control unit, a value of a theoretical time constant corresponding to the first cell; determining, a preset range of the theoretical time constant according to the value of the theoretical time constant; controlling, using the control unit, the first switch to successively turn off for a first time period, turn on for a second time period, and turn off for a third time period; controlling, using the control unit, the measure unit to measure a voltage value on the first capacitor at the end of the first time period, to produce a measured voltage value of the first cell; controlling, using the control unit, the measure unit to measure voltage values on the first capacitor at least at one time point in the third time period, to produce measured capacitance voltage values; determining, using the control unit, a value of a measured time constant according to at least one of the measured capacitance voltage values and the measured voltage value of the first cell; and determining, using the control unit, whether the battery management system is abnormal, where the battery management system is abnormal if the value of the measured time constant exceeds the preset range of the theoretical time constant.

In embodiments, a battery management system, includes: a measure unit; a control unit coupled to the measure unit; a first monitoring resistor coupled to the measure unit; a second monitoring resistor coupled to the measure unit; a first capacitor coupled to the measure unit; a first switch coupled to the measure unit; and a first balance resistor coupled to the measure unit, where a first cell in a battery pack is coupled to the first monitoring resistor, the second monitoring resistor, the first capacitor, the first switch, and the first balance resistor, where the battery management system is configured to execute a method including: calculating, using the control unit, a value of a theoretical time constant corresponding to the first cell; determining a preset range of the theoretical time constant according to the value of the theoretical time constant; controlling, using the control unit, the first switch to successively turn off for a first time period, turn on for a second time period, and turn off for a third time period; controlling, using the control unit, the measure unit to measure a voltage value on the first capacitor at the end of the first time period, to produce a measured voltage value of the first cell; controlling, using the control unit, the measure unit to measure voltage values on the first capacitor at least at one time point in the third time period, to produce measured capacitance voltage values; determining, using the control unit, a value of a measured time constant according to at least one of the measured capacitance voltage values and the measured voltage value of the first cell; and determining, using the control unit, whether the battery management system is abnormal, where the battery management system is abnormal if the value of the measured time constant exceeds the preset range of the theoretical time constant.

BRIEF DESCRIPTION OF THE DRAWINGS

Features and advantages of embodiments of the present invention will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in combination with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "acquiring," "determining," "controlling," "measuring," "averaging," "calculating," or the like, refer to actions and processes of a computing system or similar electronic computing device or processor. A computing system or similar electronic computing device manipulates and transforms data represented as physical (electronic) quantities within the computing system memories, registers or other such information storage, transmission or display devices.

Figure 1:
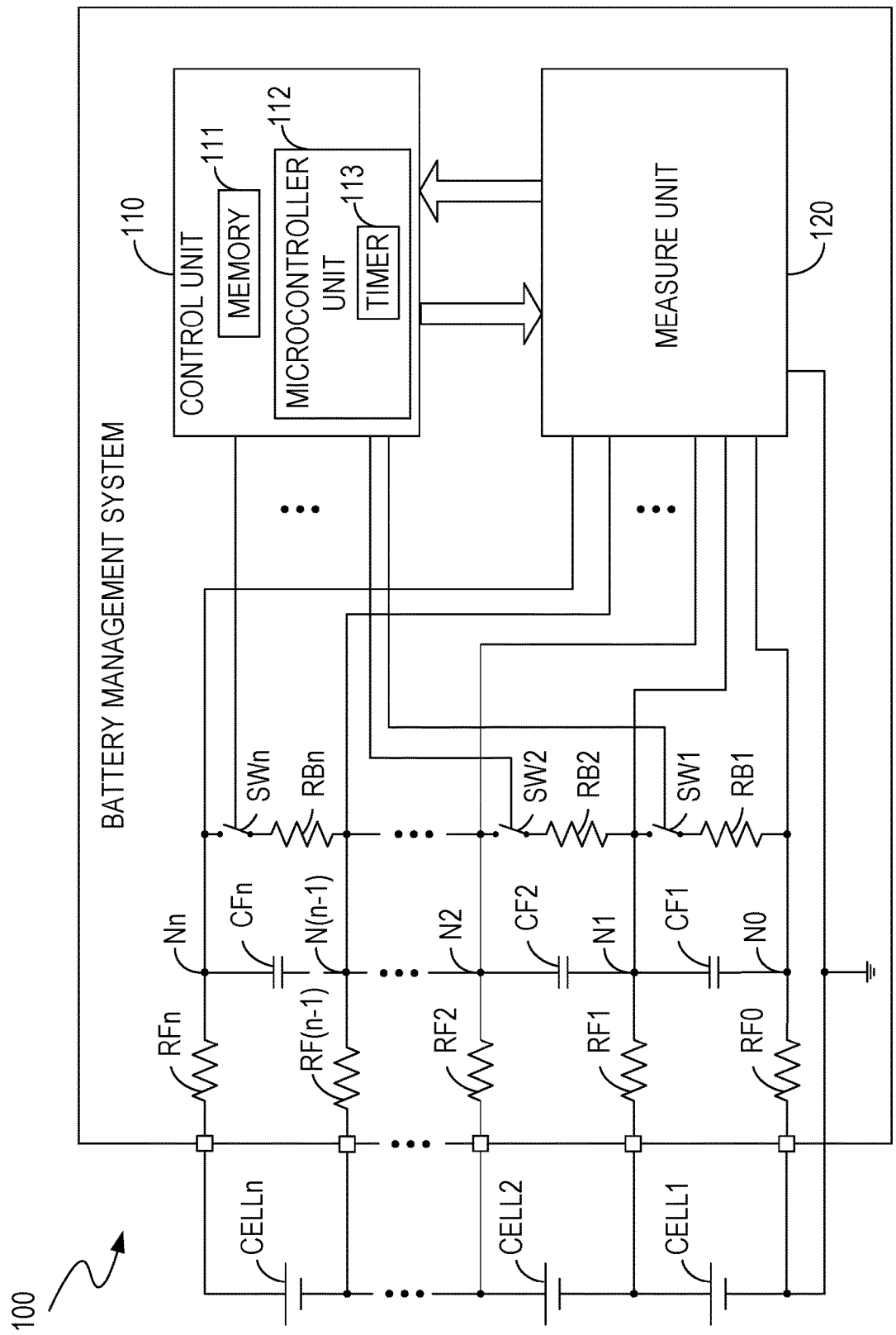
FIG. 1 shows a block diagram illustrating a battery management system, in accordance with embodiments of the present invention.

FIG. 1 shows a block diagram illustrating a battery management system 100, in accordance with embodiments of the present invention. The present invention includes methods for detecting whether the battery management system 100 is abnormal. In embodiments, such a method includes: a preset range of a theoretical time constant is determined when the battery management system 100 is normal; a measured time constant is determined; and a determination is made as to whether the battery management system 100 is abnormal by comparing the measured time constant with the preset range of the theoretical time constant.

In an embodiment, the battery pack includes a cell CELL1, CELL 2, ..., CELLn, which are coupled in series. The battery management system 100 includes monitoring resistors RF0, RF1, ..., RFn, capacitors CF1, CF2, ..., CFn, balance resistors RB1, RB2, ..., RBn, switches SW1, SW2, ..., SWn, a measure unit 120, and a control unit 110.

A monitoring resistor RFj (j=1, 2, ..., n) is coupled to a positive electrode of a cell CELLj or a negative electrode of a cell CELL(j+1). A monitoring resistor RF0 is coupled to a negative electrode of a cell CELL1. A capacitor CFj (j=1, 2, ..., n) is connected between a monitoring resistor RF(j−1) and a monitoring resistor RFj. The monitoring resistors RF0, RF1, RFn and capacitors CF1, CF2, ..., CFn together form Resistor-Capacitance (RC) filters. The RC filters are operable for filtering out the high frequency components of voltages provided by the cells, thus eliminating unwanted noise components.

The measure unit 120 is coupled to the monitoring resistors RF0, RF1, ..., RFn, and is operable for measuring voltages of the cells in the battery pack. For example, the measure unit 120 determines a voltage $V_{CELL2}$ of the cell CELL2 by measuring the difference between a voltage at a node N2 and a voltage at a node N1.

A balance resistor RBj (j=1, 2, ..., n) is coupled to a switch SWj in series. Both a balance resistor RBj and the switch SWj are operable for balancing a voltage of the cell CELLj. For example, in the discharging process, if a difference between a voltage $V_{CELL2}$ (e.g., 3V) of the cell CELL2 and a voltage $V_{CELL1}$ (e.g., 3.4V) of the cell CELL1 is greater than a balance threshold (e.g., 0.1V), then the switch SW1 is turned on and the switch SW2 is turned off, the cell CELL1 discharges and a discharge current flows through a balance resistor RB1. Consequently, the difference between $V_{CELL2}$ and $V_{CELL1}$ decreases, until the difference is less than the balance threshold. In an embodiment of the present invention, both the balance resistor RBj and the switch SWj are operable for detecting whether the battery management system 100 is abnormal. A detailed description is given below.

The control unit 110 includes a memory 111 and a microcontroller unit 112. Program codes are written into the microcontroller unit 112. The microcontroller unit 112 is configured to include or execute a timer 113, to enable the microcontroller unit 112 to run the program code according to the time sequence set by the timer 113, thereby realizing the control function and the data processing function. The memory 111 is operable for storing data, such as the theoretical time constant.

Specifically, the control unit 110 controls the switches SW1, SW2, ..., SWn to turn on/off, controls the measure unit 120 to measure a voltage on the capacitor CFj, and determines the measured time constant. Because the theoretical time constant and the preset range of the theoretical time constant are determined experimentally (e.g., before the battery management system 100 is put into use), they are stored in the memory 111. If the measured time constant is in the preset range of the theoretical time constant, then the control unit 110 determines the battery management system 100 is normal; otherwise, the battery management system 100 is abnormal.

Embodiments according to the present invention are not limited to the configuration of FIG. 1. For example, the methods described herein are applicable when the connection mode of the capacitor CFj in FIG. 1 is different, e.g., a terminal of the capacitor CFj is connected to the monitoring resistor RFj, and the other terminal is connected to ground of the battery management system 100.

Figure 2:
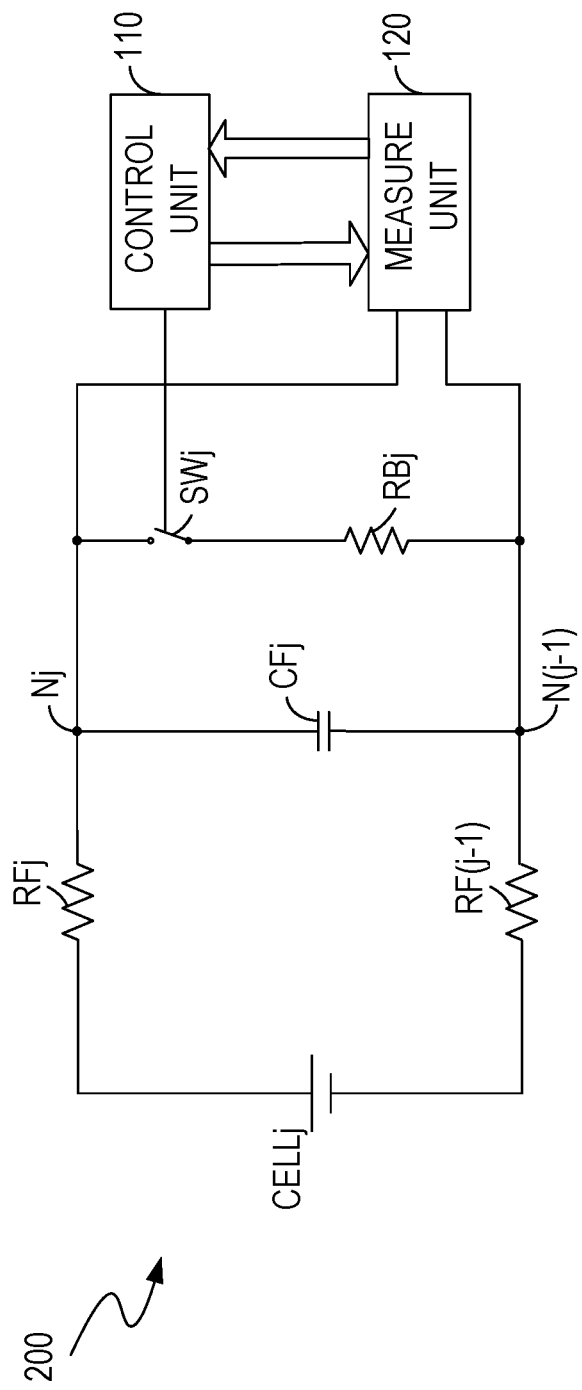
FIG. 2 shows a circuit diagram illustrating a detection performed on a cell to determine whether a battery management system is abnormal, in accordance with embodiments of the present invention.
Figure 3:
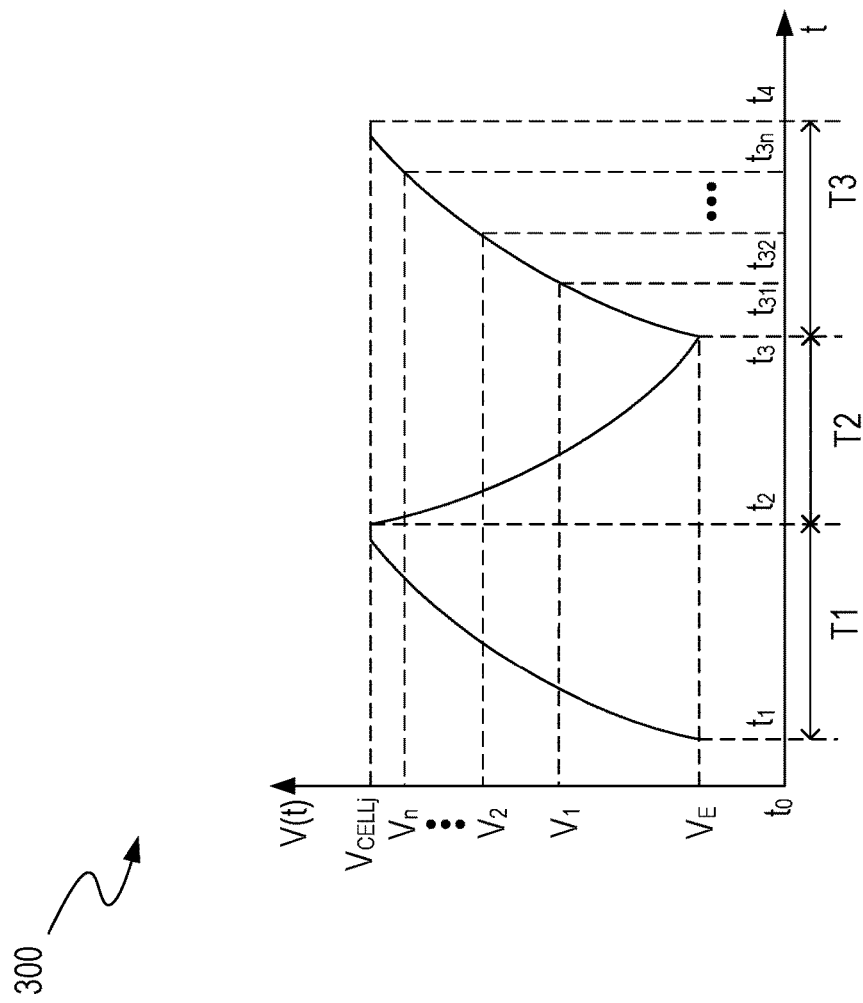
FIG. 3 shows a curve of an example of voltage values versus time on a capacitor when a battery management system is normal, in accordance with embodiments of the present invention.

FIG. 2 shows a circuit diagram illustrating a detection performed on a cell CELLj to determine whether a battery management system is abnormal, in accordance with embodiments of the present invention. FIG. 3 shows an example of the variation of the voltage values as a function of time (variation curve) on a capacitor CFj when a battery management system 100 is normal, in accordance with embodiments of the present invention, where the X-axis represents time and the Y-axis represents voltage values on the capacitor CFj. FIG. 3 is described in conjunction with FIG. 2.

(1) The Battery Management System 100 is Normal.

In the time period from $t_1$ to $t_2$ (where the time period from $t_1$ to $t_2$ is the first time period T1 of FIG. 3), the control unit 110 controls the switch SWj to turn off, and the cell CELLj charges the capacitor CFj. In the present embodiment, the capacitor CFj is fully charged at time $t_2$. At time $t_2$, the measure unit 120 measures the voltage value on the capacitor CFj (a difference between a voltage at a node N(j−1) and a voltage at a node Nj) as the voltage $V_{CELLj}$ of the cell CELLj.

In the time period from $t_2$ to $t_3$ (where the time period from $t_2$ to $t_3$ is the second time period T2 of FIG. 3), the control unit 110 controls the switch SWj to turn on, and the capacitor CFj discharges. In the present embodiment, the capacitor CFj does not discharge any more at time $t_3$. At time $t_3$, the voltage value on the capacitor CFj reaches a stable voltage value $V_E = V_{CELLj} \cdot R_{RBj}/(R_{RBj}+R_{RFj}+R_{RF(j-1)})$, where $R_{RF(j-1)}$ represents a resistance value of the monitoring resistor RF(j−1), $R_{RFj}$ represents a resistance value of the monitoring resistor RFj, and $R_{RBj}$ represents a resistance value of the monitoring resistor RBj.

In the time period from $t_3$ to $t_4$ (where the time period from $t_3$ to $t_4$ is the third time period T3 of FIG. 3), the control unit 110 controls the switch SWj to turn off, and the cell CELLj charges the capacitor CFj. In the present embodiment, the capacitor CFj is fully charged at time $t_4$. The voltage value on the capacitor CFj is recovered from $V_E$ to $V_{CELLj}$.

In the present embodiment, time $t_{31}$, time $t_{32}$, ..., time $t_{3n}$ are selected in the time period from $t_3$ to $t_4$, and the measure unit 120 respectively measures voltage values $V_1$, $V_2$, ..., $V_n$, on the capacitor CFj at time $t_{31}$, time $t_{32}$, ..., time $t_{3n}$, to determine $(V_1, \Delta t_1), (V_2, \Delta t_2), ..., (V_n, \Delta t_n)$, where $\Delta t_1$ represents the length of time between time $t_3$ and time $t_{31}$, $\Delta t_2$ represents the length of time between time $t_3$ and time $t_{32}$, ..., and $\Delta t_n$ represents the length of time between time $t_3$ and time $t_{3n}$. In the time period from $t_3$ to $t_4$, the monitoring resistors RFj, RF(j−1) and the capacitor CFj form a RC circuit, and the theoretical time constant $\tau = \Delta_i / \ln[K/(V_{CELLj}-V_i)]$, where K represents a coefficient, i=1, 2, ..., n. $(V_1, \Delta t_1), (V_2, \Delta t_2), ..., (V_n, \Delta t_n)$ are substituted in the above equation to determine the coefficient K and the theoretical time constant τ. In the present embodiment, $K=V_{CELLj}-V_E$.

The preset range of the theoretical time constant τ is determined by an allowable limit of error. For example, if the theoretical time constant τ is equal to A and the allowable limit of error is ±1/5, the preset range of the theoretical time constant τ=A±1/5. In addition, each RC circuit is located in a different position in the battery management system 100, so the theoretical time constant τ corresponding to each RC circuit is not equal.

(2) The Battery Management System 100 is Abnormal.

Abnormalities include an abnormal connection and an abnormal component. If the two terminals of the cell CELLj are not properly connected to the battery management system 100 (e.g., broken or degraded or not operating satisfactorily), then the connection between the battery management system 100 and the cell CELLj is referred to herein as an abnormal connection. If any of the capacitor CFj, the monitoring resistor RFj, and the monitoring resistor RF(j−1) is inoperative (e.g., a leakage current of the capacitor CFj, the resistance values of the monitoring resistor RFj, and/or the monitoring resistor RF(j−1) are increased/decreased), then this condition is referred to herein as an abnormal component.

For example, if the connection between the battery management system 100 and the cell CELLj is broken, then the capacitor CFj cannot be charged in the time period from $t_3$ to $t_4$ and the voltage value on the capacitor CFj remains unchanged from time $t_3$. Therefore, under ideal conditions, if the connection between the battery management system 100 and the cell CELLj is broken, then the voltage value on the capacitor CFj remains unchanged in the time period from $t_3$ to $t_4$.

For example, if a leakage current flows through the capacitor CFj, then the voltage value on the capacitor CFj is less than $V_E$ at time $t_3$ and cannot be recovered to $V_{CELLj}$ at time $t_4$. For example, if the resistance value $R_{RFj}$ of the monitoring resistor RFj and/or the resistance value $R_{RF(j-1)}$ of the monitoring resistor RF(j−1) are increased, then the voltage value on the capacitor CFj can decrease to a voltage value near $V_E$ at time $t_3$ and cannot be recovered to $V_{CELLj}$ at time $t_4$. For example, if the resistance value $R_{RFj}$ of the monitoring resistor RFj and/or the resistance value $R_{RF(j-1)}$ of the monitoring resistor RF(j−1) are decreased, then the voltage value on the capacitor CFj can decrease to a voltage value near $V_E$ at time $t_3$ and can be recovered to $V_{CELLj}$ before time $t_4$. Therefore, if one or more components among the capacitor CFj, the monitoring resistor RFj, and the monitoring resistor RF(j−1) cannot work effectively, then the variation curve of the voltage values on the capacitor CFj in the time period from $t_3$ to $t_4$ will deviate from the curve of FIG. 3 when the battery management system 100 is normal.

In summary, if any of the above abnormities has occurred in the battery management system 100, then the variation curve of the voltage values on the capacitor CFj in the time period from $t_3$ to $t_4$ will deviate from the FIG. 3 curve when the battery management system 100 is normal. Because the variation curve of the voltage values on the capacitor CFj can be reflected by the time constant (that is, the variation curve of the voltage values on the capacitor CFj varies with the time constants), embodiments of the present invention compare the measured time constant with the preset range of the theoretical time constant to determine whether the battery management system 100 is abnormal. Compared with the conventional method (which compares the voltage values on the capacitor CFj with the cell tap open thresthod $V_{CTO}$), methods in accordance with the present invention can accurately determine whether any of the above abnormities has occurred in the battery management system 100, to avoid an incorrect diagnosis and improve the detection accuracy.

Figure 4:
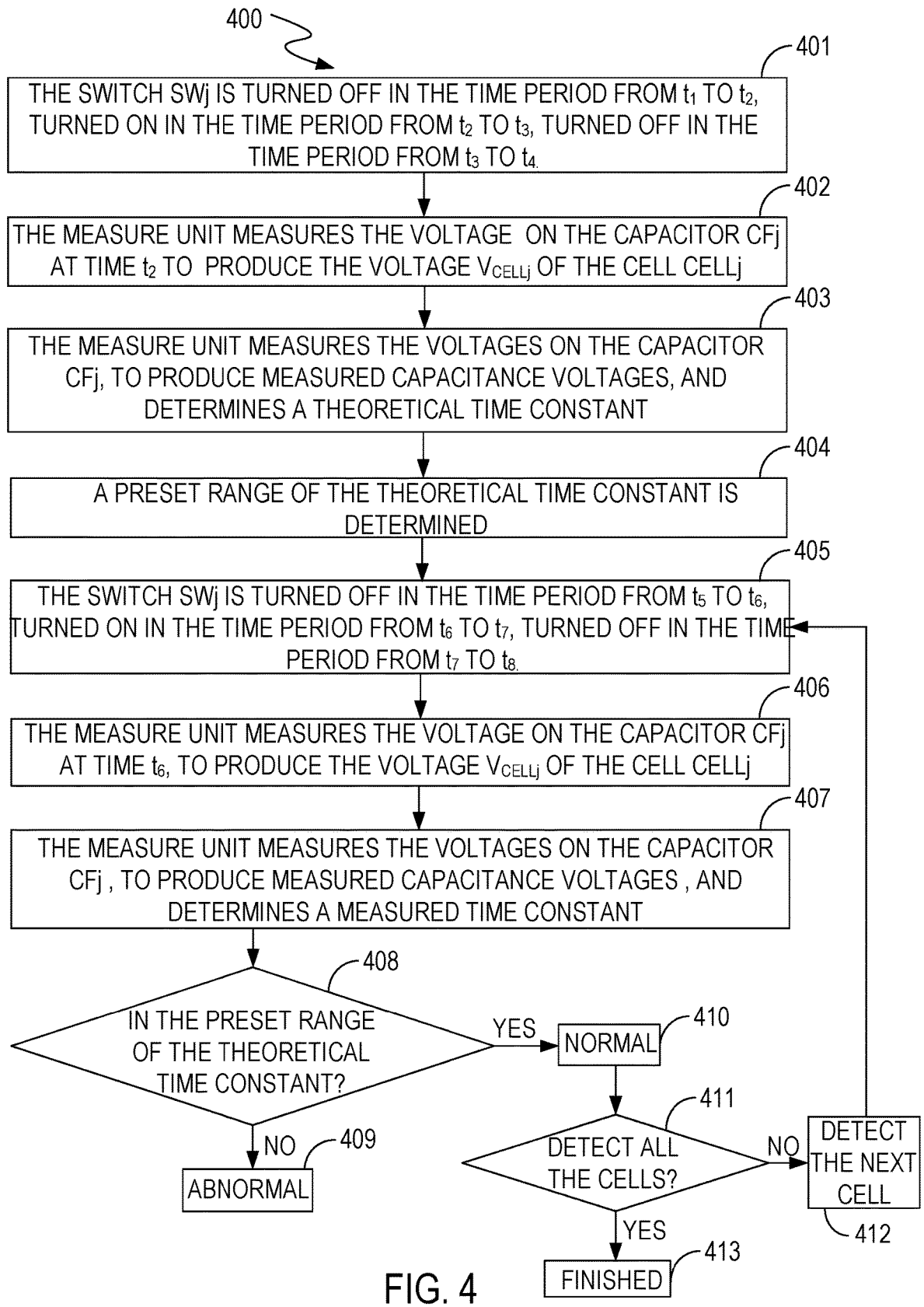
FIG. 4 shows a flowchart of a method for detecting whether a battery management system is abnormal, in accordance with embodiments of the present invention.
Figure 5:
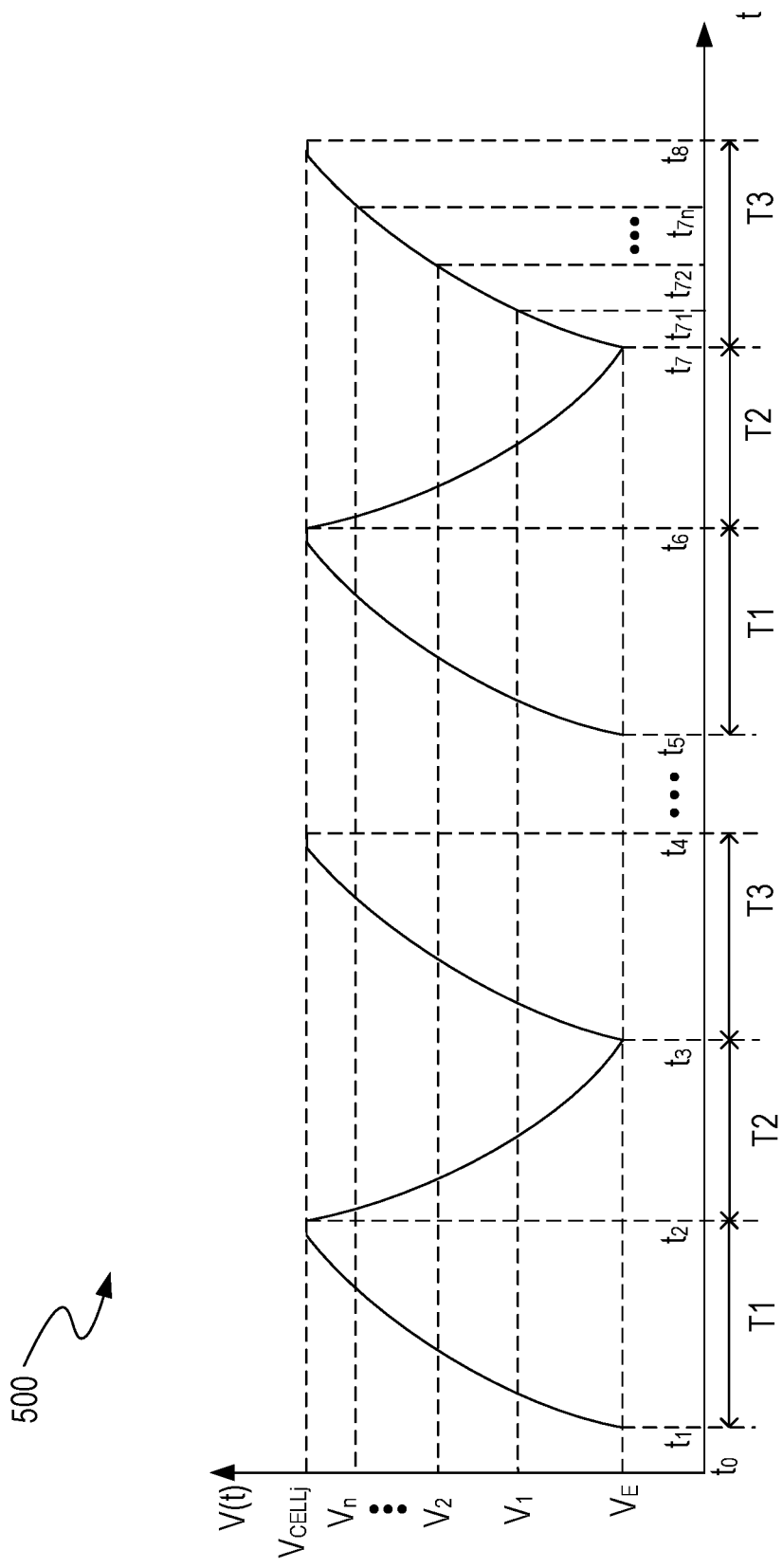
FIG. 5 shows an example of voltage values versus time on a capacitor, in accordance with embodiments of the present invention.

FIG. 4 shows a flowchart 400 of a method for detecting whether a battery management system 100 is abnormal, in accordance with embodiments of the present invention. FIG. 4 is described in conjunction with FIG. 2 and FIG. 5.

In step 401, when the battery management 100 is normal, the control unit 110 controls the switch SWj to turn off in the time period from $t_1$ to $t_2$, turn on in the time period from $t_2$ to $t_3$, and turn off in the time period from $t_3$ to $t_4$, where $t_2-t_1=T1$, $t_3-t_2=T2$, and $t_4-t_3=T3$.

In step 402, the control unit 110 controls the measure unit 120 to measure the voltage value on the capacitor CFj at time $t_2$, to produce the voltage $V_{CELLj}$ of the cell CELLj.

In step 403, the control unit 110 controls the measure unit 120 to measure the voltage values on the capacitor CFj at least at one time point in the time period from $t_3$ to $t_4$, to produce measured capacitance voltage value(s). The control unit 110 determines a theoretical time constant according to at least one measured capacitance voltage value and the measured voltage value $V_{CELLj}$ of the cell CELLj. In an embodiment, the theoretical time constant is an experimentally determined value. Methods for determining the measured time constant are described in conjunction with the embodiments in FIG. 6, FIG. 7, FIG. 8, FIG. 9, and FIG. 11.

In step 404, a preset range of the theoretical time constant is determined according to the theoretical time constant. Both the theoretical time constant and the preset range of the theoretical time constant are stored in the memory 111 of the control unit 110.

In step 405, when detecting whether the battery management system 100 is abnormal, the control unit 110 controls the switch SWj to turn off in the time period from $t_5$ to $t_6$, turn on in the time period from $t_6$ to $t_7$, and turn off in the time period from $t_7$ to $t_8$, where $t_6-t_5=t_2-t_1=T1$, $t_7-t_6=t_3-t_2=T2$, and $t_8-t_7=t_4-t_3=T3$.

In step 406, the control unit 110 controls the measure unit 120 to measure the voltage value on the capacitor CFj at time $t_6$, to produce the voltage $V_{CELLj}$ of the cell CELLj.

In step 407, the control unit 110 controls the measure unit 120 to measure the voltage values on the capacitor CFj at least at one time point in the time period from $t_7$ to $t_8$, to produce measured capacitance voltage values. The control unit 110 determines a measured time constant according to at least one measured capacitance voltage and the measured voltage value of the cell CELLj. Methods for determining the measured time constant are described in conjunction with the embodiments in FIG. 6, FIG. 7, FIG. 8, FIG. 9, and FIG. 11.

In step 408, the control unit 110 determines whether the measured time constant is in the preset range of the theoretical time constant. If yes, then step 408 is followed by step 410; otherwise, step 408 is followed by step 409.

In step 409, the control unit 110 determines that the battery management system 100 is abnormal, and generates an alarm to alert the users.

In step 410, the control unit 110 determines that the battery management system 100 is normal.

In step 411, the control unit 110 determines whether all of the cells are detected. If yes, then step 411 is followed by step 413; otherwise, step 411 is followed by step 412.

In step 412, the battery management system 100 starts to detect the next cell, and the method returns to step 405.

In step 413, the detection process of FIG. 4 is finished.

Figure 6:
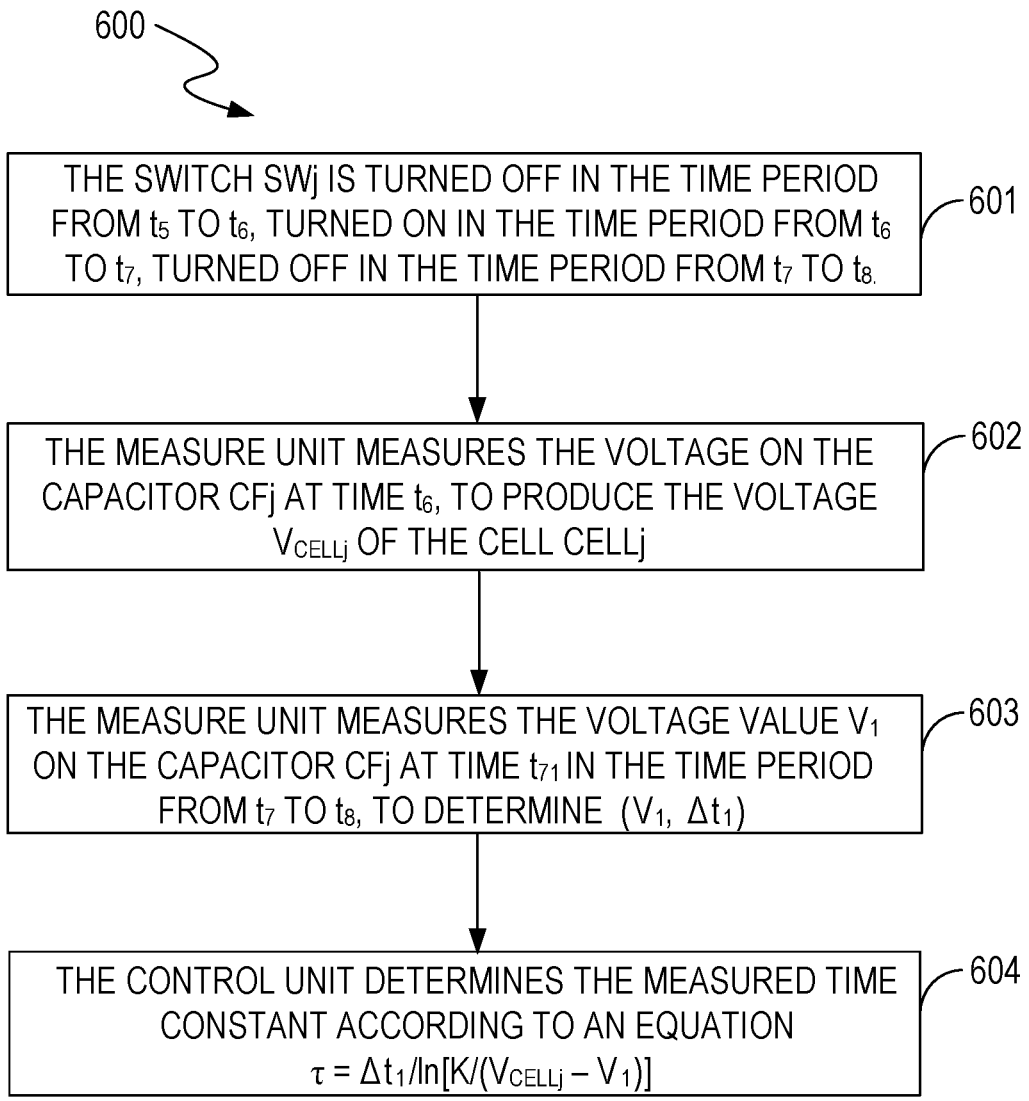
FIG. 6 shows a flowchart of a method for detecting whether a battery management system is abnormal, in accordance with embodiments of the present invention.

Methods for determining the theoretical time constant are similar to the methods for determining the measured time constant. FIG. 6 shows a flowchart 600 of a method for detecting whether a battery management system 100 is abnormal, in accordance with embodiments of the present invention. FIG. 6 is described in conjunction with FIG. 2 and FIG. 5.

In step 601, the control unit 110 controls the switch SWj to turn off in the time period from $t_5$ to $t_6$, turn on from $t_6$ to $t_7$, and turn off in the time period from $t_7$ to $t_8$, where $t_6-t_5=t_2-t_1=T1$, $t_7-t_6=t_3-t_2=T2$, and $t_8-t_7=t_4-t_3=T3$.

In step 602, the control unit 110 controls the measure unit 120 to measure the voltage value on the capacitor CFj at time $t_6$, to produce the voltage $V_{CELLj}$ of the cell CELLj.

In step 603, the control unit 110 controls the measure unit 120 to measure the voltage value $V_1$ on the capacitor CFj at time $t_{71}$ in the time period from $t_7$ to $t_8$, to determine ($V_1$, $\Delta t_1$), where $\Delta t_1$ is the length of time between $t_1$ and $t_{71}$.

In step 604, the control unit 110 determines the measured time constant according to the equation $\tau=\Delta t_1/\ln[K/(V_{CELLj}-V_1)]$. In the present embodiment, $K=V_{CELLj}-V_E$.

Figure 7:
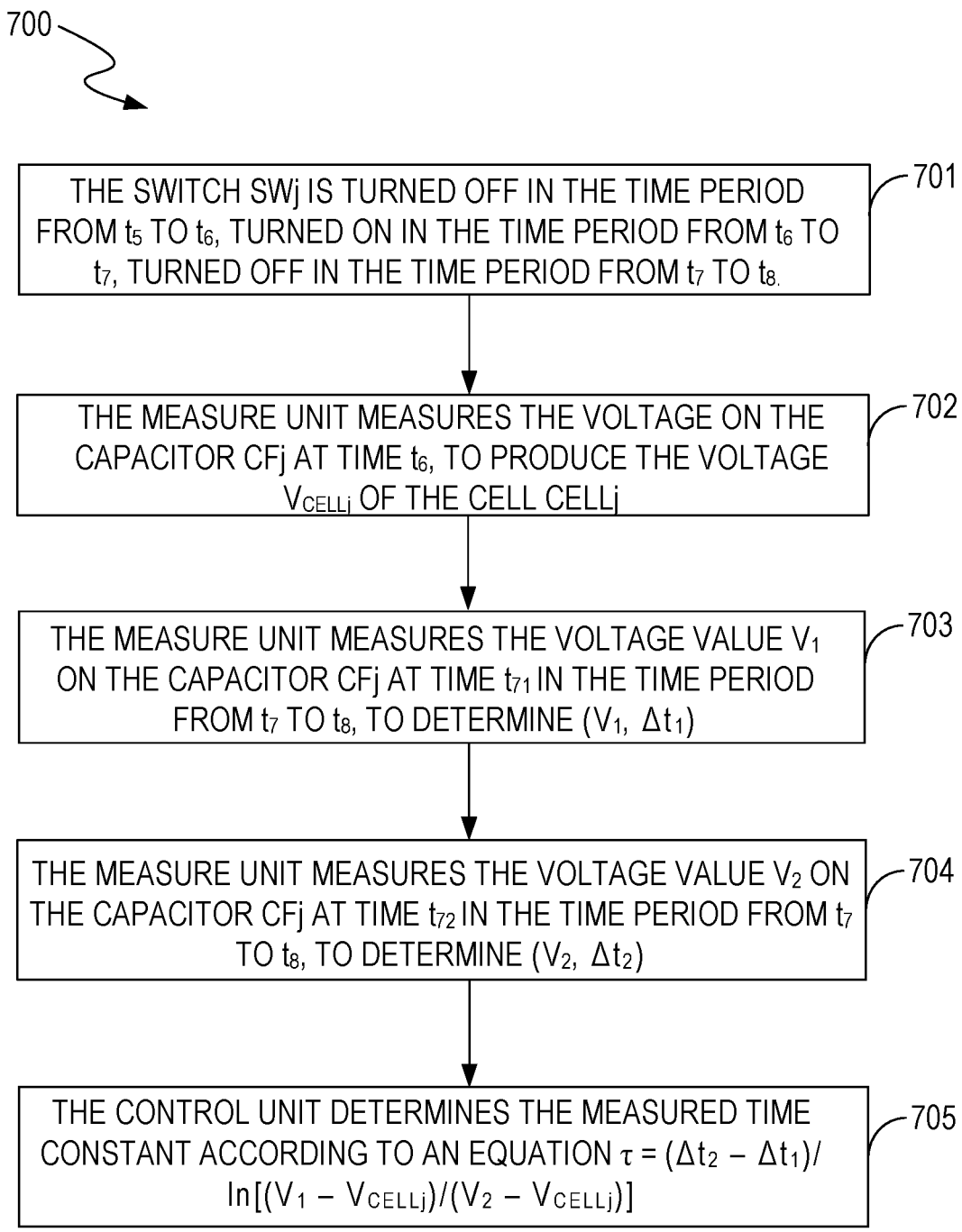
FIG. 7 shows a flowchart of a method for detecting whether a battery management system is abnormal, in accordance with embodiments of the present invention.

FIG. 7 shows a flowchart 700 of a method for detecting whether a battery management system 100 is abnormal, in accordance with embodiments of the present invention. FIG. 7 is described in conjunction with FIG. 2 and FIG. 5. If the length of time of the third time period T3 is long enough for the control unit 110 to complete the calculation, the method of FIG. 7 can be used to determine the measured time constant. Compared with the embodiment of FIG. 6, the embodiment of FIG. 7 can further improve the accuracy of the measured time constant, thereby improving the detection accuracy.

In step 701, the control unit 110 controls the switch SWj to turn off in the time period from $t_5$ to $t_6$, turn on in the time period from $t_6$ to $t_7$, and turn off in the time period from $t_7$ to $t_8$, where $t_6-t_5=t_2-t_1=T1$, $t_7-t_6=t_3-t_2=T2$, and $t_8-t_7=t_4-t_3=T3$.

In step 702, the control unit 110 controls the measure unit 120 to measure the voltage values on the capacitor CFj at time $t_6$, to produce the voltage $V_{CELLj}$ of the cell CELLj.

In step 703, the control unit 110 controls the measure unit 120 to measure the voltage value $V_1$ on the capacitor CFj at time $t_{71}$ in the time period from $t_7$ to $t_8$, to determine ($V_1$, $\Delta t_1$), where $\Delta t_1$ is the length of time between $t_7$ and $t_{71}$.

In step 704, the control unit 110 controls the measure unit 120 to measure the voltage value $V_2$ on the capacitor CFj at time $t_{72}$ in the time period from $t_7$ to $t_8$, to determine ($V_2$, $\Delta t_2$), where $\Delta t_2$ is the length of time between $t_7$ and $t_{72}$, and $\Delta t_2$ is not equal to $\Delta t_1$.

In step 705, the control unit 110 determines the measured time constant $\tau$ according to the equation $\tau=(\Delta t_2-\Delta t_1)/\ln[(V_1-V_{CELLj})/(V_2-V_{CELLj})]$.

Figure 8:
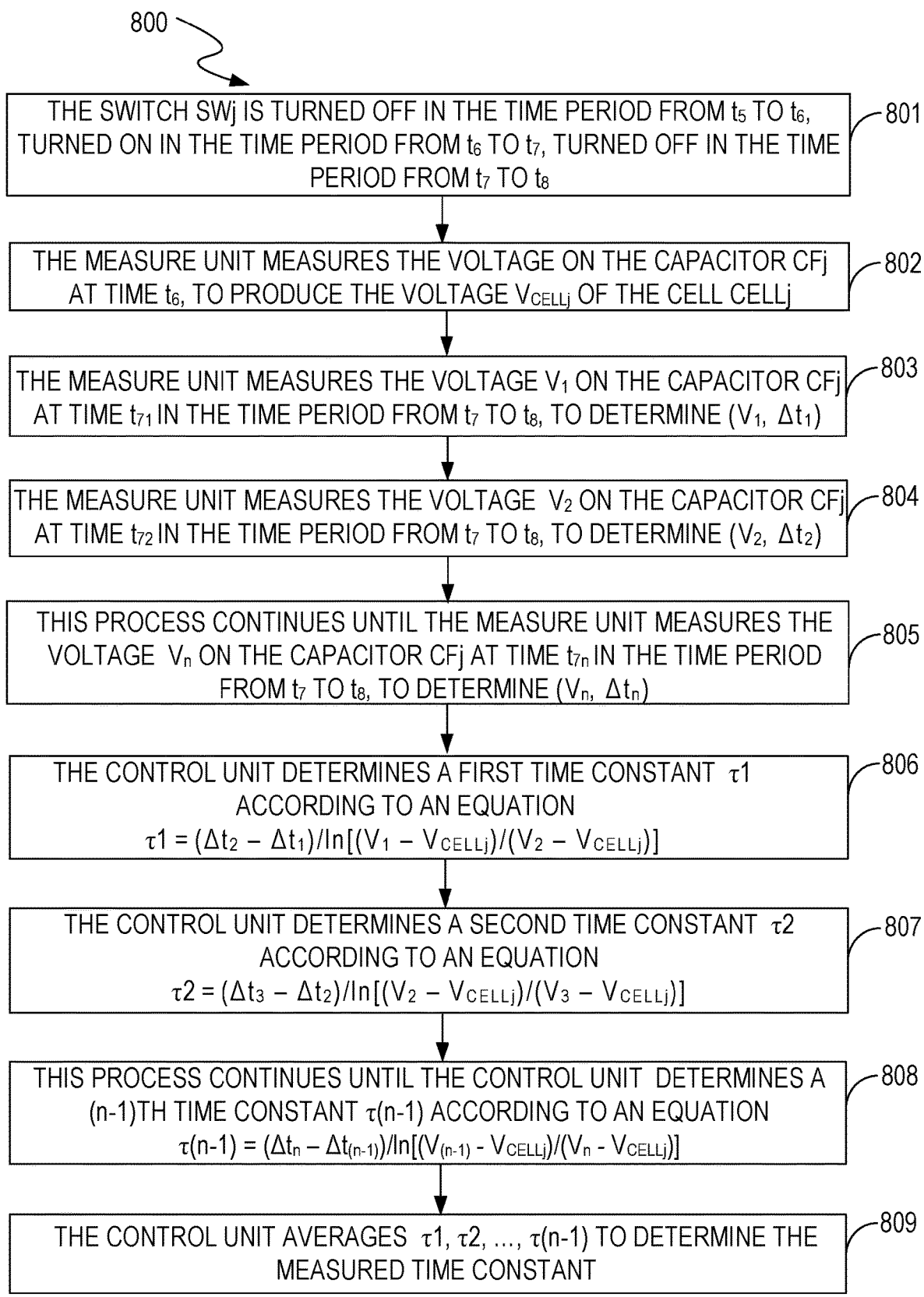
FIG. 8 shows a flowchart of a method for detecting whether a battery management system is abnormal, in accordance with embodiments of the present invention.

FIG. 8 shows a flowchart 800 of a method for detecting whether a battery management system 100 is abnormal, in accordance with embodiments of the present invention. FIG. 8 is described in conjunction with FIG. 2 and FIG. 5. If the length of time of the third time period T3 is long enough for the control unit 110 to complete the calculation, the method of FIG. 8 can be used to determine the measured time constant. Compared with the embodiment of FIG. 7, the embodiment of FIG. 8 can further improve the accuracy of the measured time constant, thereby improving the detection accuracy.

In step 801, the control unit 110 controls the switch SWj to turn off in the time period from $t_5$ to $t_6$, turn on in the time period from $t_6$ to $t_7$, and turn off in the time period from $t_7$ to $t_8$, where $t_6-t_5=t_2-t_1=T1$, $t_7-t_6=t_3-t_2=T2$, and $t_8-t_7=t_4-t_3=T3$.

In step 802, the control unit 110 controls the measure unit 120 to measure the voltage value on the capacitor CFj at time $t_6$, to produce the voltage $V_{CELLj}$ of the cell CELLj.

In step 803, the control unit 110 controls the measure unit 120 to measure the voltage value $V_1$ on the capacitor CFj at time $t_{71}$ in the time period from $t_7$ to $t_8$, to determine $(V_1, \Delta t_1)$, where $\Delta t_1$ is the length of time between $t_7$ and $t_{71}$.

In step 804, the control unit 110 controls the measure unit 120 to measure the voltage value $V_2$ on the capacitor CFj at time $t_{72}$ in the time period from $t_7$ to $t_8$, to determine $(V_2, \Delta t_2)$, where $\Delta t_n$ is the length of time between $t_7$ and $t_{72}$, and $\Delta t_2$ is not equal to $\Delta t_1$.

In step 805, this process continues until the control unit 110 controls the measure unit 120 to measure the voltage value $V_n$ on the capacitor CFj at time $t_{7n}$ in the time period from $t_7$ to $t_8$, to determine $(V_n, \Delta t_n)$, where $\Delta t_n$ is the length of time between $t_7$ and $t_{7n}$. In the embodiment, $\Delta t_1$, $\Delta t_2$, ..., $\Delta t_n$ are not equal to each other. In other embodiments, $\Delta t_n \neq \Delta t_{(n-1)}$, ..., $\Delta t_3 \neq \Delta t_2$, $\Delta t_2 \neq \Delta t_1$. Here, two adjacent time periods are not equal.

In step 806, the control unit 110 determines a first time constant τ1 according to the equation $\tau 1=(\Delta t_2-\Delta t_1)/\ln[(V_1-V_{CELLj})/(V_2-V_{CELLj})]$.

In step 807, the control unit 110 determines a second time constant T2 according to the equation $\tau 2=(\Delta t_3-\Delta t_2)/\ln[(V_2-V_{CELLj})/(V_3-V_{CELLj})]$.

In step 808, this process continues until the control unit 110 determines a (n−1)th time constant Δ(n−1) according to the equation $\Delta(n-1)=(\Delta t_n-\Delta t_{(n-1)})/\ln[(V_{(n-1)}-V_{CELLj})/(V_n-V_{CELLj})]$.

In step 809, the control unit 110 averages τ1, τ2, ..., τ(n−1) to determine the measured time constant. In other embodiments, other methods can be used to calculate τ1, τ2, ..., τ(n−1) to determine the measured time constant.

Figure 9:
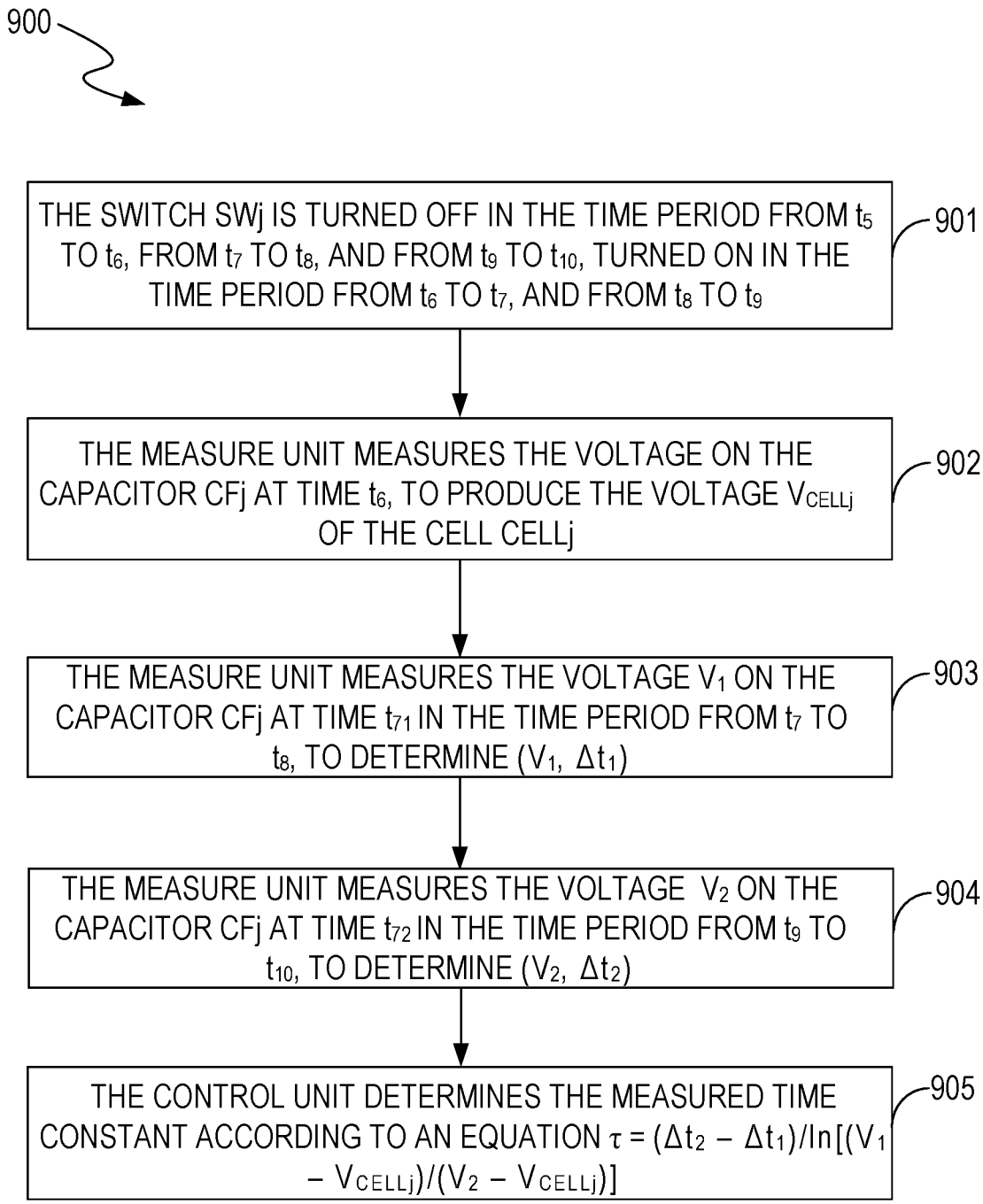
FIG. 9 shows a flowchart of a method for detecting whether a battery management system is abnormal, in accordance with embodiments of the present invention.
Figure 10:
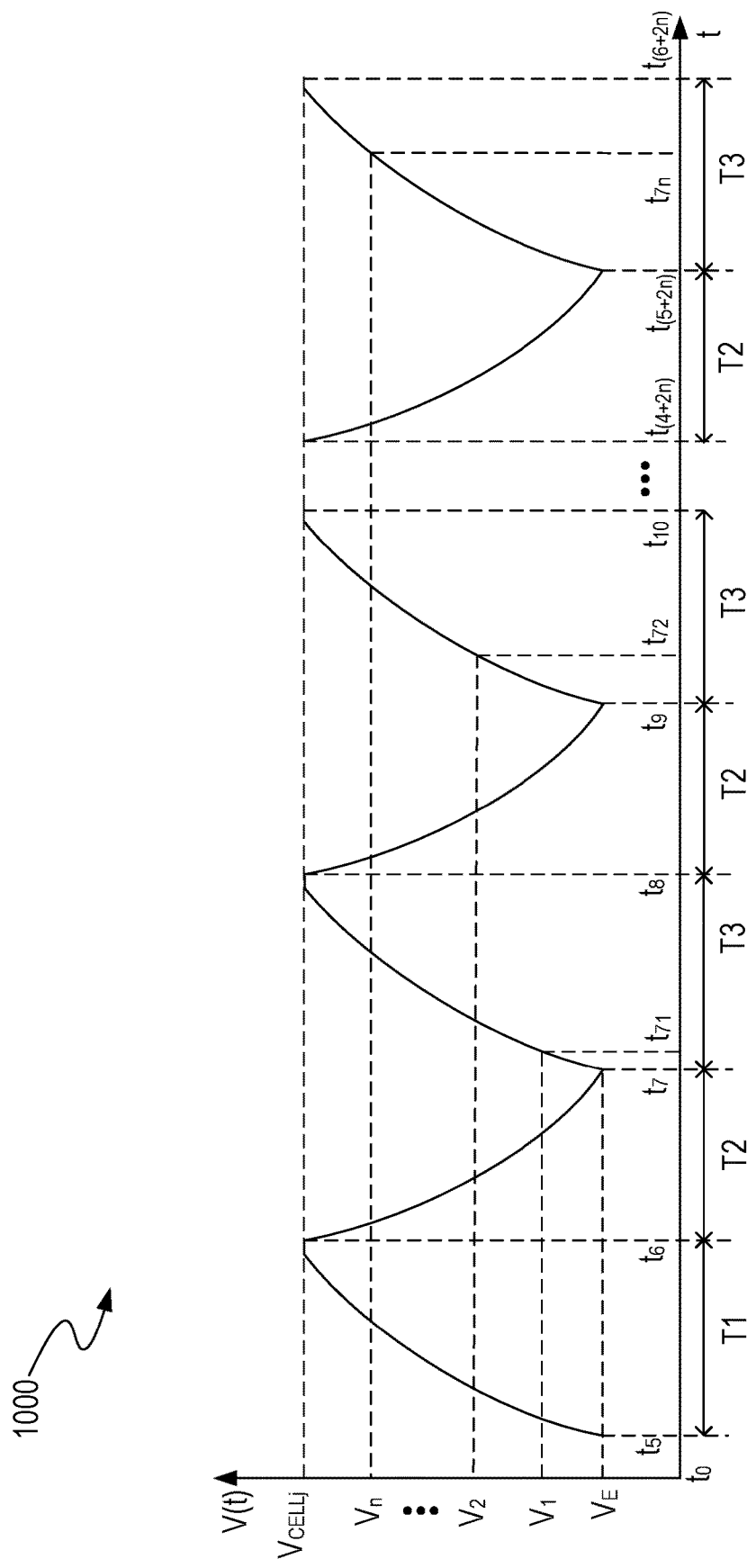
FIG. 10 shows a curve of an example of voltage values versus time on a capacitor, in accordance with embodiments of the present invention.

FIG. 9 shows a flowchart 900 of a method for detecting whether a battery management system 100 is abnormal, in accordance with embodiments of the present invention. FIG. 9 is described in conjunction with FIG. 2 and FIG. 10. Compared with the embodiment of FIG. 6, the embodiment of FIG. 9 can reduce uncertainty in the measured time constant that may be introduced by uncertainty in the coefficient K, thereby improving the detection accuracy.

In step 901, the control unit 110 controls the switch SWj to turn off in the time period from $t_5$ to $t_6$, from $t_7$ to $t_8$, and from $t_9$ to $t_{10}$, and turn on in the time period from $t_6$ to $t_7$ and from $t_6$ to $t_9$, where $t_6-t_5=t_2-t_1=T1$, $t_7-t_6=t_3-t_2=T2$, and $t_8-t_7=t_4-t_3=T3$.

In step 902, the control unit 110 controls the measure unit 120 to measure the voltage value on the capacitor CFj at time $t_6$, to produce the voltage $V_{CELLj}$ of the cell CELLj.

In step 903, the control unit 110 controls the measure unit 120 to measure the voltage value $V_1$ on the capacitor CFj at time $t_{71}$ in the time period from $t_7$ to $t_8$, to determine $(V_1, \Delta t_1)$, where $\Delta t_1$ is the length of time between $t_7$ and $t_{71}$.

In step 904, the control unit 110 controls the measure unit 120 to measure the voltage value $V_2$ on the capacitor CFj at time $t_{72}$ in the time period from $t_9$ to $t_{10}$, to determine $(V_2, \Delta t_2)$, where $\Delta t_2$ is the length of time between $t_9$ and $t_{72}$, and $\Delta t_2$ is not equal to $\Delta t_1$.

In step 905, the control unit 110 determines the measured time constant τ according to the equation $\tau=(\Delta t_2-\Delta t_1)/\ln[(V_1-V_{CELLj})/(V_2-V_{CELLj})]$.

Figure 11:
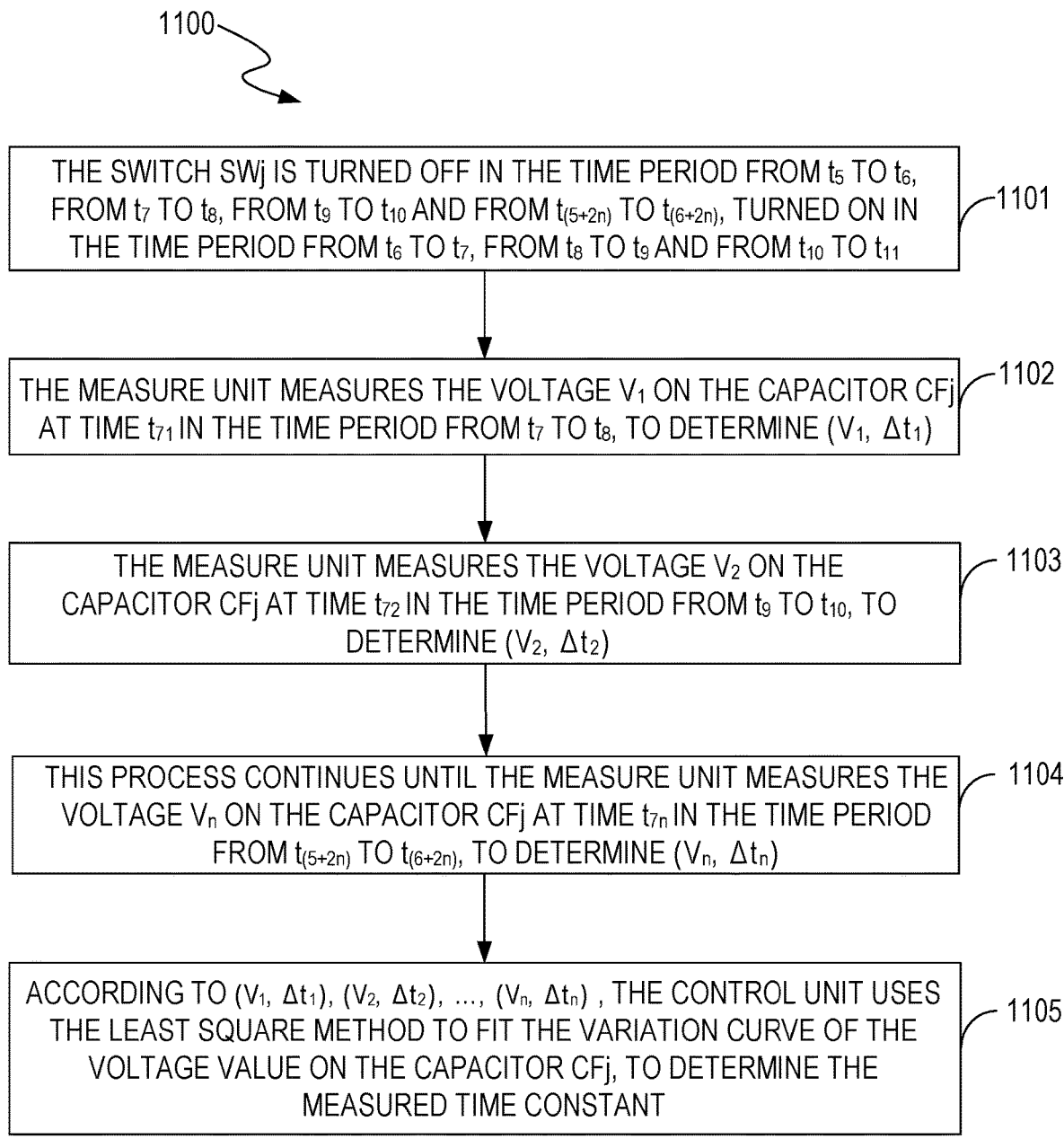
FIG. 11 shows a flowchart of a method for detecting whether a battery management system is abnormal, in accordance with embodiments of the present invention.

FIG. 11 shows a flowchart 1100 of a method for detecting whether a battery management system 100 is abnormal, in accordance with embodiments of the present invention. FIG. 11 is described in conjunction with FIG. 2 and FIG. 10. Compared with the embodiment of FIG. 9, the embodiment of FIG. 11 can further improve the accuracy of the measured time constant, thereby improving detection accuracy.

In step 1101, the control unit 110 controls the switch SWj to turn off in the time period from $t_5$ to $t_6$, from $t_7$ to $t_8$, from $t_9$ to $t_{10}$, and from $t_{(5+2n)}$ to $t_{(6+2n)}$, and turn on in the time period from $t_6$ to $t_7$, from $t_8$ to $t_9$, and from $t_{10}$ to $t_{11}$, n=3, 4, ..., where $t_6-t_5=t_2-t_1=T1$, $t_7-t_6=t_3-t_2=T2$, and $t_8-t_7=t_4-t_3=T3$.

In step 1102, the control unit 110 controls the measure unit 120 to measure the voltage value $V_1$ on the capacitor CFj at time $t_{71}$ in the time period from $t_7$ to $t_8$, to determine $(V_1, \Delta t_1)$, where $\Delta t_1$ is the length of time between $t_7$ and $t_{71}$.

In step 1103, the control unit 110 controls the measure unit 120 to measure the voltage value $V_2$ on the capacitor CFj at time $t_{72}$ in the time period from $t_9$ to $t_{10}$, to determine $(V_2, \Delta t_2)$, where $\Delta t_2$ is the length of time between $t_9$ and $t_{72}$, and $\Delta t_2$ is not equal to $\Delta t_1$.

In step 1104, this process continues until the control unit 110 controls the measure unit 120 to measure the voltage value $V_n$ on the capacitor CFj at time $t_{7n}$ in the time period from $t_{(5+2n)}$ to $t_{(6+2n)}$, to determine $(V_n, \Delta t_n)$, where $\Delta t_n$ is the length of time between $t_{(5+2n)}$ and $t_{7n}$. In an embodiment, $\Delta t_1$, $\Delta t_2$, ..., $\Delta t_n$ are not equal to each other. In other embodiments, two or more of $\Delta t_1$, $\Delta t_2$, ..., $\Delta t_n$ can be equal.

In step 1105, based on $(V_1, \Delta t_1)$, $(V_2, \Delta t_2)$, ..., $(V_n, \Delta t_n)$, the control unit 110 uses the least square method to fit the variation curve of the voltage value on the capacitor CFj, to determine the measured time constant. In other embodiments, other methods can be used to fit the variation curve of the voltage value on the capacitor CFj based on $(V_1, \Delta t_1)$, $(V_2, \Delta t_2)$, ..., $(V_n, \Delta t_n)$, to determine the measured time constant.

Figure 12:
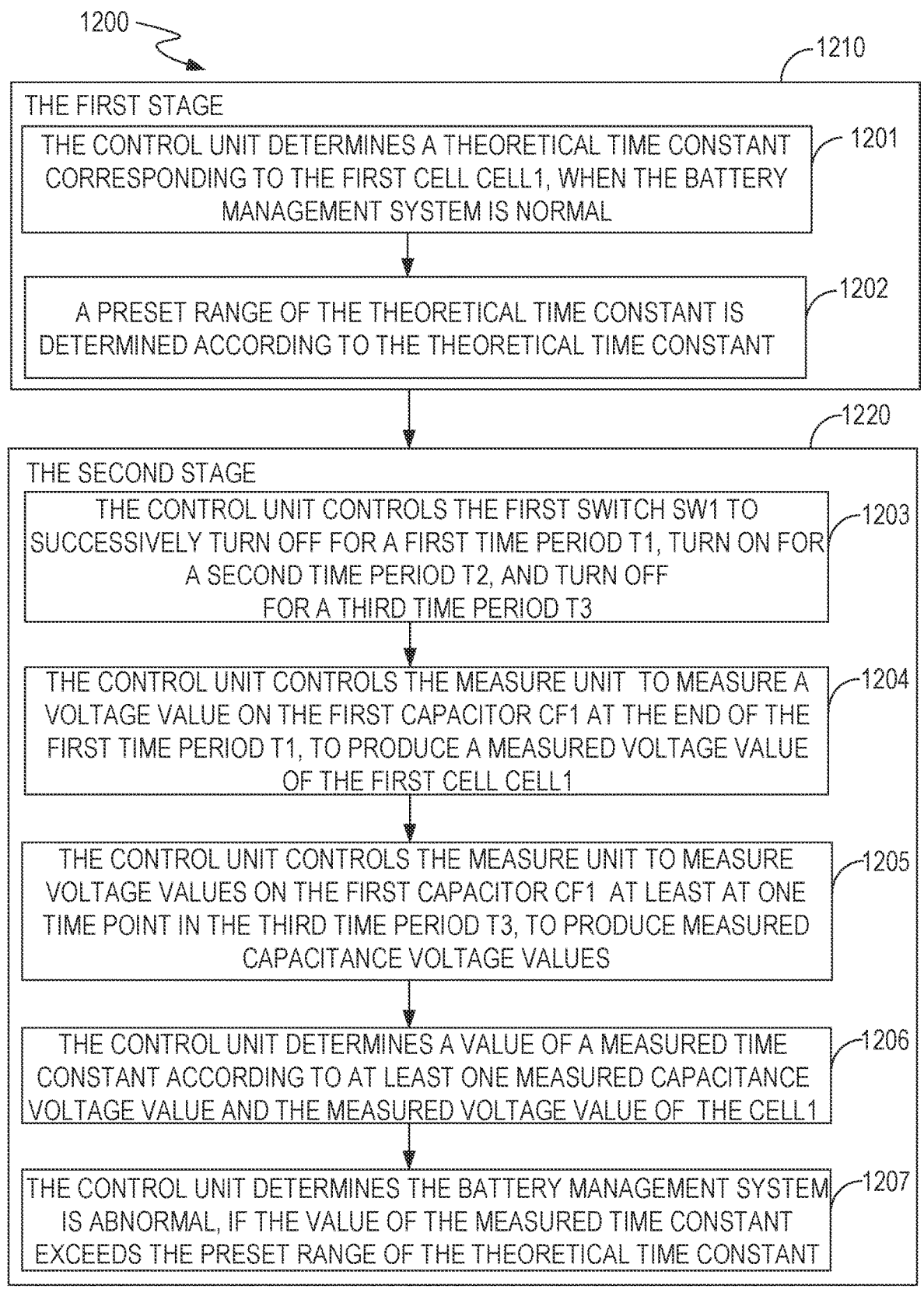
FIG. 12 shows a flowchart of a method for detecting whether a battery management system is abnormal, in accordance with embodiments of the present invention.

FIG. 12 shows a flowchart 1200 of a method for detecting whether a battery management system 100 is abnormal. FIG. 12 is described in conjunction with FIG. 1. The method includes a first stage 1210 and a second stage 1220.

The first stage 1210 includes steps 1201 and 1202.

In step 1201, the control unit 110 determines a theoretical time constant corresponding to the first cell CELL1, when the battery management system 100 is normal.

In step 1202, a preset range of the theoretical time constant is determined according to the theoretical time constant.

The second stage 1220 includes steps 1203 through 1207.

In step 1203, the control unit 110 controls the first switch SW1 to successively turn off for a first time period T1, turn on for a second time period T2, and turn off for a third time period T3.

In step 1204, the control unit 110 controls the measure unit 120 to measure a voltage value on the first capacitor CF1 at the end of the first time period T1, to produce a measured voltage value of the first cell CELL1.

In step 1205, the control unit 110 controls the measure unit 120 to measure voltage values on the first capacitor CF1 at least at one time point in the third time period T3, to produce measured capacitance voltage values.

In step 1206, the control unit 110 determines a value of a measured time constant according to at least one measured capacitance voltage value and the measured voltage value of the first cell CELL1.

In step 1207, the control unit 110 determines that the battery management system 100 is abnormal, if the value of the measured time constant exceeds the preset range of the theoretical time constant.

As mentioned above, embodiments according to the present invention pertain to methods for detecting whether a battery management system is abnormal. The method can accurately detect whether the battery management system is abnormal (e.g., the connection between the battery management system and a cell CELLj is degraded or broken, the $R_{RFj}$ and/or the $R_{RF(j-1)}$ are increased/decreased, or a leakage current of the capacitor CFj), thereby improving the detection accuracy.

While the foregoing description and drawings represent embodiments of the present invention, it will be understood that various additions, modifications, and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for detecting whether a battery management system is abnormal, wherein said battery management system comprises a measure unit, a control unit, a first monitoring resistor, a second monitoring resistor, a first capacitor, a first switch, and a first balance resistor, wherein a first cell in a battery pack is coupled to said first monitoring resistor, said second monitoring resistor, said first capacitor, said first switch, and said first balance resistor, said method comprising:
   calculating, using said control unit, a value of a theoretical time constant corresponding to said first cell;
   determining a preset range of said theoretical time constant according to said value of said theoretical time constant;
   controlling, using said control unit, said first switch to successively turn off for a first time period, turn on for a second time period, and turn off for a third time period;
   controlling, using said control unit, said measure unit to measure a voltage value on said first capacitor at the end of said first time period, to produce a measured voltage value of said first cell;
   controlling, using said control unit, said measure unit to measure voltage values on said first capacitor at least at one time point in said third time period, to produce measured capacitance voltage values;
   determining, using said control unit, a value of a measured time constant according to at least one of said measured capacitance voltage values and said measured voltage value of said first cell; and
   determining, using said control unit, whether said battery management system is abnormal, wherein said battery management system is abnormal if said value of said measured time constant exceeds said preset range of said theoretical time constant.

2. The method of claim 1, wherein said calculating a value of a theoretical time constant corresponding to said first cell comprises:
   controlling, using said control unit, said first switch to successively turn off for a fourth time period, turn on for a fifth time period, and turn off for a sixth time period, wherein said fourth time period is equal in length to said first time period, said fifth time period is equal in length to said second time period, and said sixth time period is equal in length to said third time period;
   controlling, using said control unit, said measure unit to measure voltage value on said first capacitor at the end of said fourth time period, to produce a second measured voltage value of said first cell;
   controlling, using said control unit, said measure unit to measure voltage values on said first capacitor at least at one time point in said sixth time period, to produce second measured capacitance voltage values; and
   determining, using said control unit, said theoretical time constant according to at least one of said second measured capacitance voltages and said second measured voltage value of said first cell.

3. The method of claim 1, wherein said controlling said measure unit to measure voltage values on said first capacitor at least at one time point in said third time period comprises:
   measuring, using said measure unit, a first voltage value $V_1$ on said first capacitor at a time point in said third time period, wherein a length of time between a starting time of said third time period and said time point is $\Delta t_1$; and
   determining, using said control unit, said measured time constant according to an equation $\tau = \Delta t_1 / \ln[K/(V_{CELL1} - V_1)]$, wherein $\tau$ is said measured time constant, $V_{CELL1}$ is said measured voltage value of said first cell, and K is a coefficient.

4. The method of claim 3, wherein K is equal to $V_{CELL1}$ minus $V_E$, and wherein $V_E$ is said voltage value on said first capacitor measured at the end of said second time period.

5. The method of claim 1, wherein said controlling said measure unit to measure voltage values on said first capacitor at least at one time point in said third time period comprises:
   measuring, using said measure unit, a first voltage value $V_1$ on said first capacitor at a first time point in said third time period, wherein a length of time between a starting time of said third time period and said first time point is $\Delta t_1$;
   measuring, using said measure unit, a second voltage value $V_2$ on said first capacitor at a second time point in said third time period, wherein a length of time between a starting time of said third time period and said second time point is $\Delta t_2$, wherein, $\Delta t_1$ is not equal to $\Delta t_2$; and
   determining, using said control unit, said measured time constant according to an equation $\tau = \Delta t_1 / \ln[K/(V_{CELL1} - V_1)]$, wherein $\tau$ is said measured time constant, and wherein $V_{CELL1}$ is said measured voltage value of said first cell.

6. The method of claim 1, further comprising:
   controlling, using said control unit, said first switch to turn on for a fourth time period and then turn off for a fifth time period, wherein said fourth time period is equal in length to said second time period, and wherein said fifth time period is equal in length to said third time period;

measuring, using said measure unit, a first voltage value $V_1$ on said first capacitor at a first time point in said third time period, wherein a length of time between a starting time of said third time period and said first time point is $\Delta t_1$;

measuring, using said measure unit, a second voltage value $V_2$ on said first capacitor at a second time point in said fifth time period, wherein a length of time between a starting time of said fifth time period and said second time point is $\Delta t_2$, wherein, $\Delta t_1$ is not equal to $\Delta t_2$; and determining, using said control unit, said measured time constant according to an equation $\tau = \Delta t_1 / \ln[K/(V_{CELL1} - V_1)]$, wherein $\tau$ is said measured time constant, and wherein $V_{CELL1}$ is said measured voltage value of said first cell.

7. The method of claim 1, wherein said controlling said measure unit to measure voltage values on said first capacitor at least at one time point in said third time period comprises:

measuring, using said measure unit, a first voltage value $V_1$ on said first capacitor at a first time point in said third time period, wherein a length of time between a starting time of said third time period and said first time point is $\Delta t_1$;

measuring, using said measure unit, a second voltage value $V_2$ on said first capacitor at a second time point in said third time period, wherein a length of time between a starting time of said third time period and said second time point is $\Delta t_2$, wherein, $\Delta t_1$ is not equal to $\Delta t_2$;

measuring, using said measure unit, a third voltage value $V_3$ on said first capacitor at a third time point in said third time period, wherein a length of time between a starting time of said third time period and said third time point is $\Delta t_3$, wherein, $\Delta t_1$ is not equal to $\Delta t_2$, and wherein $\Delta t_2$ is not equal to $\Delta t_3$;

determining, using said control unit, a first time constant according to an equation $\tau = \Delta t_1 / \ln[K/(V_{CELL1} - V_1)]$, wherein $\tau$ is said measured time constant, and wherein $V_{CELL1}$ is said measured voltage value of said first cell;

determining, using said control unit, a second time constant according to an equation $\tau = (\Delta t_3 - \Delta t_2)/\ln[(V_2 - V_{CELL1})/(V_3 - V_{CELL1})]$, wherein $\tau$ is said measured time constant, and wherein $V_{CELL1}$ is said measured voltage value of said first cell; and determining, using said control unit, said measured time constant according to said first time constant and said second time constant.

8. The method of claim 7, wherein said determining said measured time constant according to said first time constant and said second time constant comprises:

averaging, using said control unit, said first time constant and said second time constant to determine said measured time constant.

9. The method of claim 7, further comprising:

determining, using said control unit, said measured time constant using the least square method to process $(V_1, \Delta t_1)$, $(V_2, \Delta t_2)$, and $(V_3, \Delta t_3)$.

10. The method of claim 1, further comprising:

controlling, using said control unit, said first switch to successively turn on for a fourth time period, turn off for a fifth time period, turn on for a sixth time period, and turn off for a seventh time period, wherein said fourth time period and said sixth time period are each equal in length to said second time period, and wherein said fifth time period and said seventh time period are each equal in length to said third time period;

measuring, using said measure unit, a first voltage value $V_1$ on said first capacitor at a first time point in said third time period, wherein a length of time from a starting time of said third time period to said first time point is $\Delta t_1$;

measuring, using said measure unit, a second voltage value $V_2$ on said first capacitor at a second time point in said fifth time period, wherein a length of time from a starting time of said fifth time period to said second time point is $\Delta t_2$, wherein $\Delta t_2$ not equal to $\Delta t_1$;

measuring, using said measure unit, a third voltage value $V_3$ on said first capacitor at a third time point in said seventh time period, wherein a length of time from a starting time of said seventh time period to said third time point is $\Delta t_3$, wherein $\Delta t_3$ is not equal to $\Delta t_2$ and wherein $\Delta t_2$ is not equal to $\Delta t_1$;

determining, using said control unit, a first time constant according to an equation $\tau 1 = (\Delta t_2 - \Delta t_1)/\ln[(V_1 - V_{CELLj})/(V_2 - V_{CELLj})]$, wherein $V_{CELL1}$ is said measured voltage value of said first cell;

determining, using said control unit, a second time constant according to an equation $\tau 2 = (\Delta t_3 - \Delta t_2)/\ln[(V_2 - V_{CELL1})/(V_3 - V_{CELL1})]$, wherein $\tau$ is said measured time constant, and wherein $V_{CELL1}$ is said measured voltage value of said first cell;

determining, using said control unit, said measured time constant according to said first time constant and said second time constant.

11. A battery management system, comprising a measure unit;

a control unit coupled to said measure unit;

a first monitoring resistor coupled to said measure unit;

a second monitoring resistor coupled to said measure unit;

a first capacitor coupled to said measure unit;

a first switch coupled to said measure unit; and a first balance resistor coupled to said measure unit, wherein a first cell in a battery pack is coupled to said first monitoring resistor, said second monitoring resistor, said first capacitor, said first switch, and said first balance resistor, wherein said battery management system is configured to execute a method comprising:

calculating, using said control unit, a value of a theoretical time constant corresponding to said first cell;

determining a preset range of said theoretical time constant according to said value of said theoretical time constant;

controlling, using said control unit, said first switch to successively turn off for a first time period, turn on for a second time period, and turn off for a third time period;

controlling, using said control unit, said measure unit to measure a voltage value on said first capacitor at the end of said first time period, to produce a measured voltage value of said first cell;

controlling, using said control unit, said measure unit to measure voltage values on said first capacitor at least at one time point in said third time period, to produce measured capacitance voltage values;

determining, using said control unit, a value of a measured time constant according to at least one of said measured capacitance voltage values and said measured voltage value of said first cell; and determining, using said control unit, whether said battery management system is abnormal, wherein said battery management system is abnormal if said value of said measured time constant exceeds said preset range of said theoretical time constant.

12. The system of claim 11, wherein said calculating a value of a theoretical time constant corresponding to said first cell comprises:
controlling, using said control unit, said first switch to successively turn off for a fourth time period, turn on for a fifth time period, and turn off for a sixth time period, wherein said fourth time period is equal in length to said first time period, said fifth time period is equal in length to said second time period, and said sixth time period is equal in length to said third time period;
controlling, using said control unit, said measure unit to measure voltage value on said first capacitor at the end of said fourth time period, to produce a second measured voltage value of said first cell;
controlling, using said control unit, said measure unit to measure voltage values on said first capacitor at least at one time point in said sixth time period, to produce second measured capacitance voltage values; and
determining, using said control unit, said theoretical time constant according to at least one of said second measured capacitance voltages and said second measured voltage value of said first cell.

13. The system of claim 11, wherein said controlling said measure unit to measure voltage values on said first capacitor at least at one time point in said third time period comprises:
measuring, using said measure unit, a first voltage value $V_1$ on said first capacitor at a time point in said third time period, wherein a length of time between a starting time of said third time period and said time point is $\Delta t_1$; and
determining, using said control unit, said measured time constant according to an equation $\tau=\Delta t_1/\ln[K/(V_{CELL1}-V_1)]$, wherein $\tau$ is said measured time constant, $V_{CELL1}$ is said measured voltage value of said first cell, and $K$ is a coefficient.

14. The system of claim 13, wherein $K$ is equal to $V_{CELL1}$ minus $V_E$, and wherein $V_E$ is said voltage value on said first capacitor measured at the end of said second time period.

15. The system of claim 11, wherein said controlling said measure unit to measure voltage values on said first capacitor at least at one time point in said third time period comprises:
measuring, using said measure unit, a first voltage value $V_1$ on said first capacitor at a first time point in said third time period, wherein a length of time between a starting time of said third time period and said first time point is $\Delta t_1$;
measuring, using said measure unit, a second voltage value $V_2$ on said first capacitor at a second time point in said third time period, wherein a length of time between a starting time of said third time period and said second time point is $\Delta t_2$, wherein $\Delta t_2$ is not equal to $\Delta t_2$; and
determining, using said control unit, said measured time constant according to an equation $\tau=(\Delta t_2-\Delta t_1)/\ln[(V_1-V_{CELL1})/(V_2-V_{CELL1})]$, wherein $\tau$ is said measured time constant, and wherein $V_{CELL1}$ is said measured voltage value of said first cell.

16. The system of claim 11, wherein said method further comprises:
controlling, using said control unit, said first switch to turn on for a fourth time period and then turn off for a fifth time period, wherein said fourth time period is equal in length to said second time period, and wherein said fifth time period is equal in length to said third time period;
measuring, using said measure unit, a first voltage value $V_1$ on said first capacitor at a first time point in said third time period, wherein a length of time between a starting time of said third time period and said first time point is $\Delta t_1$;
measuring, using said measure unit, a second voltage value $V_2$ on said first capacitor at a second time point in said fifth time period, wherein a length of time between a starting time of said fifth time period and said second time point is $\Delta t_2$, wherein $\Delta t_2$ is not equal to $\Delta t_2$; and
determining, using said control unit, said measured time constant according to an equation $\tau=(\Delta t_2-\Delta t_1)/\ln[(V_1-V_{CELL1})/(V_2-V_{CELL1})]$, wherein $\tau$ is said measured time constant, and wherein $V_{CELL1}$ is said measured voltage value of said first cell.

17. The system of claim 11, wherein said controlling said measure unit to measure voltage values on said first capacitor at least at one time point in said third time period comprises:
measuring, using said measure unit, a first voltage value $V_1$ on said first capacitor at a first time point in said third time period, wherein a length of time between a starting time of said third time period and said first time point is $\Delta t_1$;
measuring, using said measure unit, a second voltage value $V_2$ on said first capacitor at a second time point in said third time period, wherein a length of time between a starting time of said third time period and said second time point is $\Delta t_2$, wherein $\Delta t_2$ is not equal to $\Delta t_2$;
measuring, using said measure unit, a third voltage value $V_3$ on said first capacitor at a third time point in said third time period, wherein a length of time between a starting time of said third time period and said third time point is $\Delta t_3$, wherein $\Delta t_1$ is not equal to $\Delta t_2$, and wherein $\Delta t_2$ is not equal to $\Delta t_3$;
determining, using said control unit, a first time constant according to an equation $\tau=(\Delta t_2-\Delta t_1)/\ln[(V_1-V_{CELL1})/(V_2-V_{CELL1})]$, wherein $\tau$ is said measured time constant, and wherein $V_{CELL1}$ is said measured voltage value of said first cell;
determining, using said control unit, a second time constant according to an equation $\tau=(\Delta t_3-\Delta t_2)/\ln[(V_2-V_{CELL1})/(V_3-V_{CELL1})]$, wherein $\tau$ is said measured time constant, and wherein $V_{CELL1}$ is said measured voltage value of said first cell; and
determining, using said control unit, said measured time constant according to said first time constant and said second time constant.

18. The system of claim 17, wherein said determining said measured time constant according to said first time constant and said second time constant comprises:
averaging, using said control unit, said first time constant and said second time constant to determine said measured time constant.

19. The system of claim 17, wherein said method further comprises:
determining, using said control unit, said measured time constant using the least square method to process $(\Delta_1, \Delta t_1)$, $(\Delta_2, \Delta t_2)$, and $(V_3, \Delta t_3)$.

20. The system of claim 11, wherein said method further comprises:
- controlling, using said control unit, said first switch to successively turn on for a fourth time period, turn off for a fifth time period, turn on for a sixth time period, and turn off for a seventh time period, wherein said fourth time period and said sixth time period are each equal in length to said second time period, and wherein said fifth time period and said seventh time period are each equal in length to said third time period;
- measuring, using said measure unit, a first voltage value $V_1$ on said first capacitor at a first time point in said third time period, wherein a length of time from a starting time of said third time period to said first time point is $\Delta t_1$;
- measuring, using said measure unit, a second voltage value $V_2$ on said first capacitor at a second time point in said fifth time period, wherein a length of time from a starting time of said fifth time period to said second time point is $\Delta t_2$, wherein $\Delta t_2$ not equal to $\Delta t_1$;
- measuring, using said measure unit, a third voltage value $V_3$ on said first capacitor at a third time point in said seventh time period, wherein a length of time from a starting time of said seventh time period to said third time point is $\Delta t_3$, wherein $\Delta t_3$ is not equal to $\Delta t_2$ and wherein $\Delta t_2$ is not equal to $\Delta t_1$;
- determining, using said control unit, a first time constant according to an equation $\tau 1=(\Delta t_2-\Delta t_1)/\ln[(V_1-V_{CELLj})/(V_2-V_{CELLj})]$, wherein $V_{CELL1}$ is said measured voltage value of said first cell;
- determining, using said control unit, a second time constant according to an equation $\tau 2=(\Delta t_3-\Delta t_2)/\ln[(V_2-V_{CELL1})/(V_3-V_{CELL1})]$, wherein $\tau$ is said measured time constant, and wherein $V_{CELL1}$ is said measured voltage value of said first cell;
- determining, using said control unit, said measured time constant according to said first time constant and said second time constant.

* * * * *